United States Patent
Kang

(10) Patent No.: US 6,483,760 B2
(45) Date of Patent: Nov. 19, 2002

(54) SEMICONDUCTOR MEMORY INTEGRATED CIRCUIT OPERATING AT DIFFERENT TEST MODES

(75) Inventor: Young-Gu Kang, Kyunggi-do (KR)

(73) Assignee: Samsung Electronics Co., Ltd., Kyunggi-do (KR)

(*) Notice: Subject to any disclaimer, the term of this patent is extended or adjusted under 35 U.S.C. 154(b) by 0 days.

(21) Appl. No.: 09/834,498

(22) Filed: Apr. 13, 2001

(65) Prior Publication Data

US 2002/0008509 A1 Jan. 24, 2002

(30) Foreign Application Priority Data

Jul. 20, 2000 (KR) .............................. 00-41655

(51) Int. Cl.[7] ................................. G11C 7/00
(52) U.S. Cl. .............. 365/201; 365/230.03; 365/230.08
(58) Field of Search ........................... 365/201, 189.07, 365/230.01, 230.03, 230.08, 189.05, 191

(56) References Cited

U.S. PATENT DOCUMENTS

| | | | |
|---|---|---|---|
| 4,563,640 A | | 1/1986 | Hasegawa ................ 324/158 P |
| 5,072,138 A | * | 12/1991 | Slemmer et al. ............ 307/465 |
| 5,134,587 A | * | 7/1992 | Steele ........................ 365/201 |
| 5,706,232 A | * | 1/1998 | McClure et al. ............ 365/201 |
| 5,864,565 A | * | 1/1999 | Ochoa et al. ................. 371/24 |

OTHER PUBLICATIONS

Betty Prince, "High Performance Memories, New architecture DRAMs and SRAMs evolution and function," (1999) pp. 152–154.

* cited by examiner

Primary Examiner—David Nelms
Assistant Examiner—Thong Le
(74) Attorney, Agent, or Firm—Skjerven Morrill LLP

(57) ABSTRACT

A semiconductor integrated circuit includes a memory cell array, a read circuit that reads test data from the memory cell array, a parallel test control circuit, a bit organization address control circuit, and a parallel test circuit. The parallel test control circuit, in response to a wafer test flag signal, a package test flag signal, and a bank activation signal, generates a first control signal and a second control signal. The bit organization address control circuit, in response to the wafer test flag signal, the package test flag signal, the bank activation signal, and a bit organization information signal, generates a third control signal. The parallel test circuit, in response to the first and second control signals, determines whether all bits of the test data read have the same logic levels. The first, second, and third control signals determines where the test data are read from in the memory cell array.

8 Claims, 6 Drawing Sheets

| Fig. 6A | Fig. 6B |

SEMICONDUCTOR MEMORY INTEGRATED CIRCUIT OPERATING AT DIFFERENT TEST MODES

BACKGROUND

Manufacturing of semiconductor integrated circuits includes various processes such as design, wafer fabrication, packaging, and test. Test of the semiconductor integrated circuits are performed before or after the packaging, depending on whether the test is a parameter test or a burn-in test. The parameter test determines before the packaging whether each fabricated integrated circuit is good or not. Only those integrated circuits that passed the parameter test are packaged and burn-in tested.

A fixed probe board for testing semiconductor integrated circuit chips is disclosed in U.S. Pat. No. 4,563,640 entitled "FIXED PROBE BOARD", which is incorporated herein by reference in its entirety. The probe board includes multiple probe needles (or pins) mounted on a support base. The probe pins correspond to pads on a chip, such as data input/output pads, control signal pads, address pads, and command pads. The probe board disclosed in the '640 patent cannot test a number of integrated circuit chips simultaneously. Hereinafter, simultaneous testing of multiple integrated circuit chips is referred to as "a parallel test".

In order to perform the parallel test, the number and allocation of the probe pins must be controlled to increase the number of integrated circuit chips tested simultaneously. The number of probe pins is limited within a probe board (or probe card) due to physical and manufacturing limitations of the probe card. If the number of pads on each integrated circuit chip increases and if the probe pins contact all of the pads, the number of integrated circuit chips tested simultaneously will decrease. That is, the number of probe pins allocated to each integrated circuit chip must be reduced to test as many semiconductor integrated circuit chips as possible at the same time.

For reducing the time spent for test and therefore, the manufacturing cost of integrated circuits, it is desirable to increase the number of semiconductor integrated circuit chips simultaneously tested by effectively allocating the probe pins.

SUMMARY

An embodiment of the present invention provides a semiconductor integrated circuit that can enable effective test thereof. The semiconductor integrated circuit includes: a memory cell array having multiple banks; a row selection circuit that selects one of the banks and a row of each of the array blocks in the selected bank; a read circuit that reads test data from the selected bank; a parallel test control circuit; a bit organization address control circuit; and a parallel test circuit.

The parallel test control circuit, in response to a wafer test flag signal, a package test flag signal, and a bank activation signal, generates a first control signal and a second control signal. The bit organization address control circuit, in response to the wafer test flag signal, the package test flag signal, the bank activation signal, and a bit organization information signal, generates a third control signal. The parallel test circuit, in response to the first and second control signals, determines whether all bits of the test data read have the same logic levels. The first, second, and third control signals determines where the test data are read from in the memory cell array.

The semiconductor integrated circuit further includes a mode register set circuit and an address buffer circuit. The mode register set circuit outputs the wafer test flag signal, the package test flag signal, and the bank activation signal. The address buffer circuit receives the first, second, and third control signals, and an address signal, and determines whether the address signal is used in determining where the test data are read from in the memory cell array. In addition, the parallel test circuit has a plurality of first to third comparators.

BRIEF DESCRIPTION OF THE DRAWINGS

A more complete appreciation of the present invention and many of the attendant advantages thereof will become better understood by reference to the following detailed description in conjunction with the accompanying drawings in which like reference symbols indicate the same or similar components, wherein.

DETAILED DESCRIPTION

The present invention provides a semiconductor memory integrated circuit that is capable of operating at various test modes.

Figure 1:
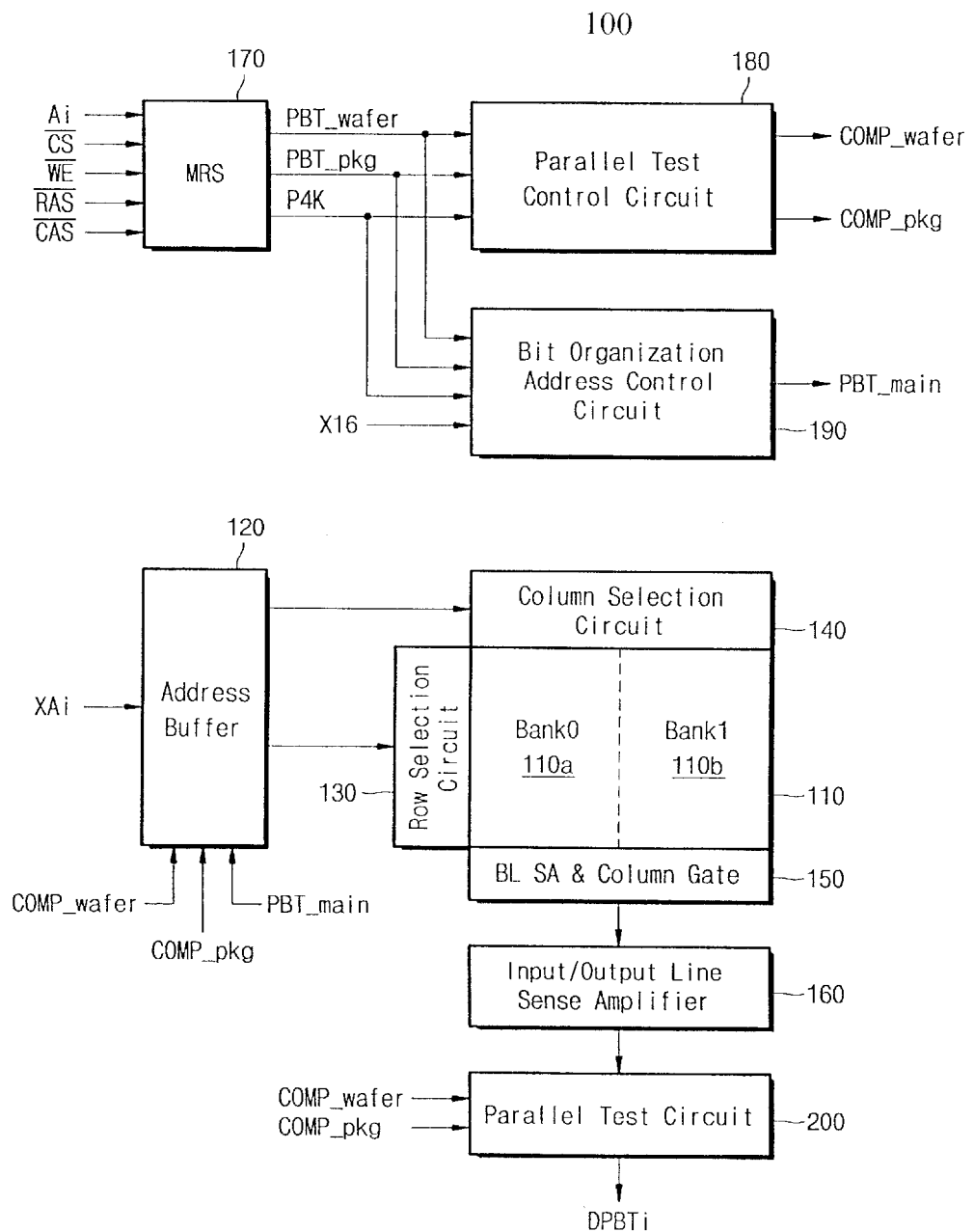
FIG. 1 is a block diagram of a semiconductor integrated circuit memory device according to an embodiment of the present invention.

FIG. 1 is a block diagram showing a semiconductor integrated circuit 100, which is a dynamic random access memory device (DRAM), according to an embodiment of the present invention. Semiconductor integrated circuit 100 has ×4, ×8 or ×16 bit organization according to an address signal for selecting bit organization (hereinafter, referred to as "a bit organization address signal"). Semiconductor integrated circuit 100 includes a memory cell array 110 that stores data bit information. Memory cell array 110 includes two banks 110a and 110b. Semiconductor integrated circuit 100 further includes an address buffer circuit 120, a row selection circuit 130, a column selection circuit 140, a bit line sense amplifier and column gate circuit 150, and an input/output line sense amplifier circuit 160. The above constituent elements 120 to 160 are well known to ones skilled in the art, and detailed description of elements 120 to 160 is thus omitted.

Figure 2:
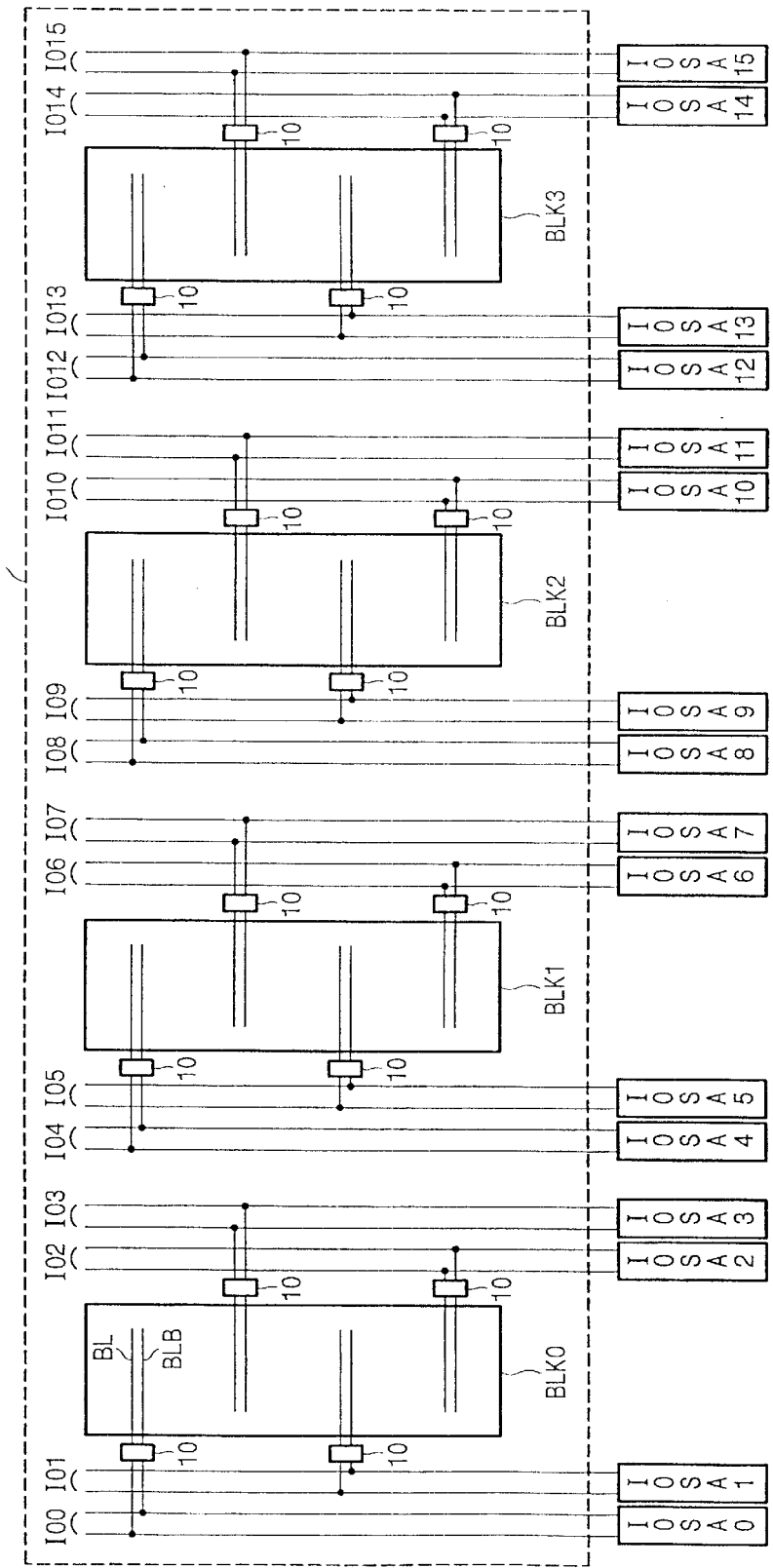
FIG. 2 is a diagram illustrating an array structure and a bit organization of one bank of FIG. 1.

FIG. 2 is a diagram of bank 110a, which is structurally identical to bank 110b. Bank 110a stores data bit information and is divided into four memory blocks BLK0 to BLK3 that are side by side each other. At the right side of each of memory blocks BLK0 to BLK3, two pairs of input/output lines are arranged in parallel to each of memory blocks BLK0 to BLK3. Similarly, at the left side of each of memory block BLK0 to BLK3, two pairs of input/output lines are arranged in parallel to each of memory blocks BLK0 to BLK3. For instance, two input/output line pairs IO0 and IO1 are arranged at the left side of memory block BLK0, and two input/output line pairs IO2 and IO3 are arranged at the right side of memory block BLK0. Input/output line pairs IO4 and IO5 to IO14 and IO15 are similarly arranged. Although not shown in FIG. 2, word lines are in each of memory blocks BLK0 to BLK3 in parallel to input/output line pairs IO0 and IO15. In a read operation, row selection circuit 130 selects one of the word lines in each of memory block BLK0 to BLK3, so that sixteen data bits are read from bank 110a through corresponding input/output line pairs.

As illustrated in FIG. 2, input/output line sense amplifiers IOSA0 to IOSA15 are connected to corresponding input/output line pair IO0 to IO15. Each of the input/output line pairs IO0 to IO15 are connected to a corresponding bit line pair BL and BLB, which are in each of memory block BLK0 to BLK3, through corresponding bit line sense amplifier and column gate circuit 150 (FIG. 1), which includes column gate 10. Input/output line sense amplifiers IOSA0 to IOSA15 read data from each of memory blocks BLK0 to BLK3, through bit line sense amplifier and column gate circuit 150 and input/output line pairs IO0 to IO15 according to a well-known read operation. Data bits thus read are transferred to a parallel test circuit 200 (FIG. 1) during test operation of semiconductor integrated circuit 100 (FIG. 1). Reference symbol DPBTi of FIG. 1 indicates a signal that shows whether or not data bits read from each bank have the same value. Signal DPBTi is further illustrated later with reference to FIG. 6.

Input/output line drivers (not shown) are connected to input/output line pairs IO0 to IO15, respectively. Each of the input/output line drivers receives a data bit to be written to a corresponding memory block, and then drives a corresponding input/output line pair to transfer the data bit to a corresponding memory block. Column selection circuit 140, bit line sense amplifier and column gate circuit 150 and input/output line sense amplifier circuit 160 constitute a read circuit.

Referring to FIG. 1 again, semiconductor integrated circuit 100 further includes a mode register set (MRS) circuit 170, a parallel test control circuit 180, and a bit organization address control circuit 190. Mode register set circuit 170 is programmed after power is applied and before a normal operation (or a test operation) is performed. When signals $\overline{CS}$, $\overline{WE}$, $\overline{RAS}$ and $\overline{CAS}$ are low, semiconductor integrated circuit 100 enters a normal mode operation or a test mode operation in accordance with how mode register set circuit 170 was programmed by address signal Ai. The structure of mode register set circuit 170 is well known, and is disclosed fully in "*High Performance Memories: New Architecture DRAMs and SRAMs—evolution and function*" by Betty Prince (pp.150–151), which is herein incorporated by reference in its entirety.

When semiconductor integrated circuit 100 enters the test mode operation, mode register set circuit 170 activates one among a wafer test flag signal PBT_wafer, a package test flag signal PBT_pkg, and a bank activation signal P4K according to address signal Ai. Wafer test flag signal PBT_wafer activates a wafer test mode operation, and package test flag signal PBT_pkg activates a package test mode operation. Bank activation signal P4K activates banks 110a and 110b simultaneously, so that semiconductor integrated circuit 100 operates under the bit organization of ×8.

Figure 3:
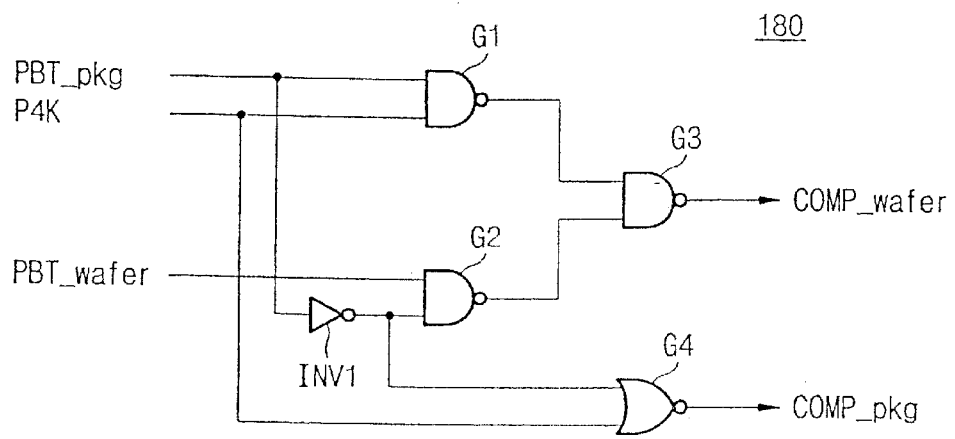
FIG. 3 is a circuit diagram of a parallel test control circuit of FIG. 1.

Parallel test control circuit 180 generates control signals COMP_wafer and COMP_pkg in response to signals PBT_wafer, PBT_pkg, and P4K from mode register set circuit 170. FIG. 3 shows an embodiment of parallel test control circuit 180, which includes three NAND gates G1, G2, and G3, an inverter INV1 and a NOR gate G4. When signal PBT_wafer is at logic high level and signals PBT_pkg and P4K are at logic low level, control signal COMP_wafer is activated high and the control signal COMP_pkg is inactivated low. When signal PBT_pkg is high and signals PBT_wafer and P4K are low, control signal COMP_wafer is inactivated low and control signal COMP_pkg is activated high. When signal P4K is high in the wafer test mode operation, control signal COMP_wafer is activated and control signal COMP_pkg is inactivated.

Figure 4:
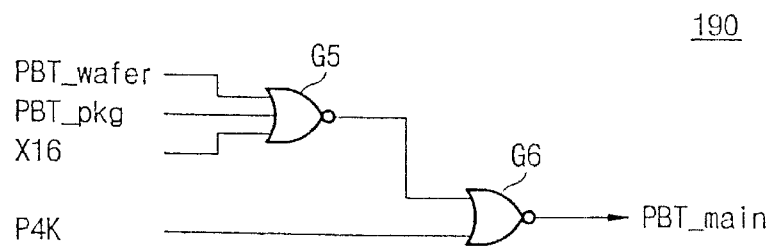
FIG. 4 is a circuit diagram of a bit organization address control circuit of FIG. 1.

Referring to FIG. 4, bit organization address control circuit 190 includes two NOR gates G5 and G6. In wafer and package test mode operations, bit organization address control circuit 190 generates a control signal PBT_main in response to signals PBT_wafer, PBT_pkg, and P4K from mode register set circuit 170 and a signal X16. Control signal PBT_main is used to activate bit organization address signal, which assigns the bit organization, among externally applied address signals. Signal X16 indicates whether semiconductor integrated circuit 100 (FIG. 1) operates with X16 bit organization. For instance, when signal X16 is at logic high level, semiconductor integrated circuit 100 operates with the bit organization of ×16. When signal X16 is at logic low level, semiconductor integrated circuit 100 operates with a different bit organization (×4 or ×8).

Referring to FIG. 4, when signal P4K is low and one of signals PBT_wafer, PBT_pkg, and X16 is high, control signal PBT_main is activated high. On the other hand, when signal P4K is activated high, the control signal PBT_main is inactivated low regardless of logic states of signals PBT_wafer, PBT_pkg, and X16.

Referring to FIG. 1, address buffer circuit 120 receives control signals COMP_wafer, COMP_pkg, and PBT_main, and an externally applied address signal XAi, which includes a first address appointing a bank and a second address appointing the bit organization of integrated circuit 100. Hereinafter, the first address is named "a bank address", and the second address is named "a bit organization address". In the wafer and package test mode operations, control signals COMP_wafer and COMP_pkg determine whether an externally applied bank address is used. For instance, when control signals COMP_wafer or COMP_pkg is activated, the externally applied bank address is set to 'don't care' state through address buffer circuit 120. That is, the externally applied bank address is not used, and a bank address from the address buffer circuit 120 is set to 'don't care' state (an activation state) by control signals COMP_wafer and COMP_pkg. As a result, banks 110a and 110b are simultaneously activated. On the other hand, when control signals COMP_wafer and COMP_pkg are inactivated, the externally applied bank address is transferred to row selection circuit 130 through address buffer circuit 120. As a result, either bank 110a or bank 110b is activated.

In the wafer and package test mode operations, control signal PBT_main determines whether an externally applied bit organization address is used. For instance, when control signal PBT_main is activated, the externally applied bit organization address becomes 'don't care' state through address buffer circuit 120. That is, the externally applied bit organization address is not used, and the bit organization address from address buffer circuit 120 is set to 'don't care' state (an activation state) by control signal PBT_main. On the other hand, when control signal PBT_main is inactivated, the externally applied bit organization address is outputted through address buffer circuit 120.

Figure 5:
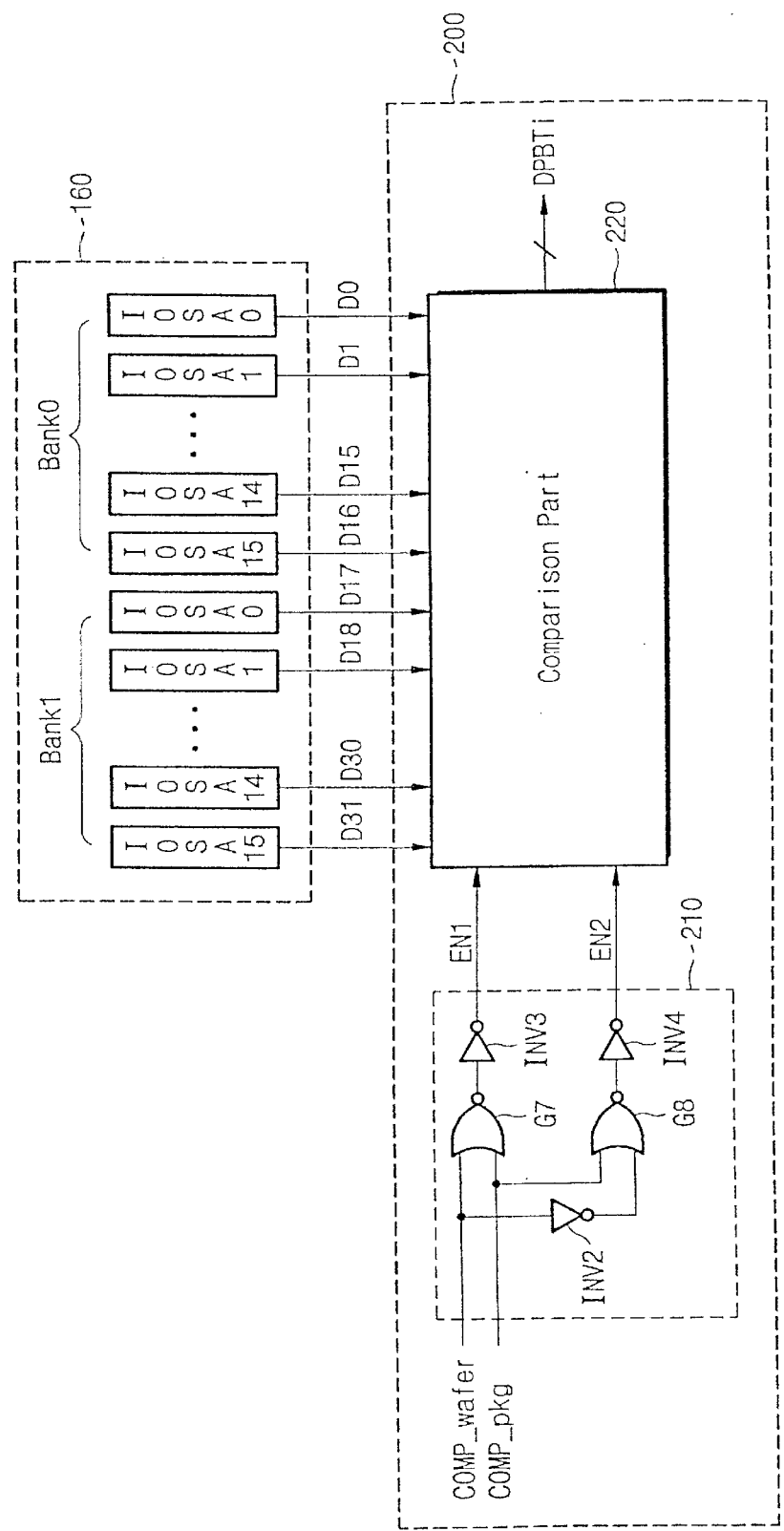
FIG. 5 is a block diagram showing a parallel test circuit of FIG. 1.

Referring to FIGS. 1 and 5, in the wafer and package test mode operation, parallel test circuit 200 receives test data bits outputted from input/output line sense amplifier circuit 160, and determines whether the received test data bits have the same logic state, in response to control signals COMP_wafer and COMP_pkg. Parallel test circuit 200 includes a signal generator 210 and a comparison part 220. Signal generator 210, which includes inverters INV2, INV3 and INV4 and NOR gates G7 and G8, generates first and second comparator enable signals EN1 and EN2 in response to control signals COMP_wafer and COMP_pkg. Comparison part 220, in response to the first and second comparator enable signals EN1 and EN2, compares test data bits Di (i=0-31) received from input/output line sense amplifiers 160. Comparison part 220 outputs comparison result values through an output buffer circuit (not shown).

Figures 6, 6A:
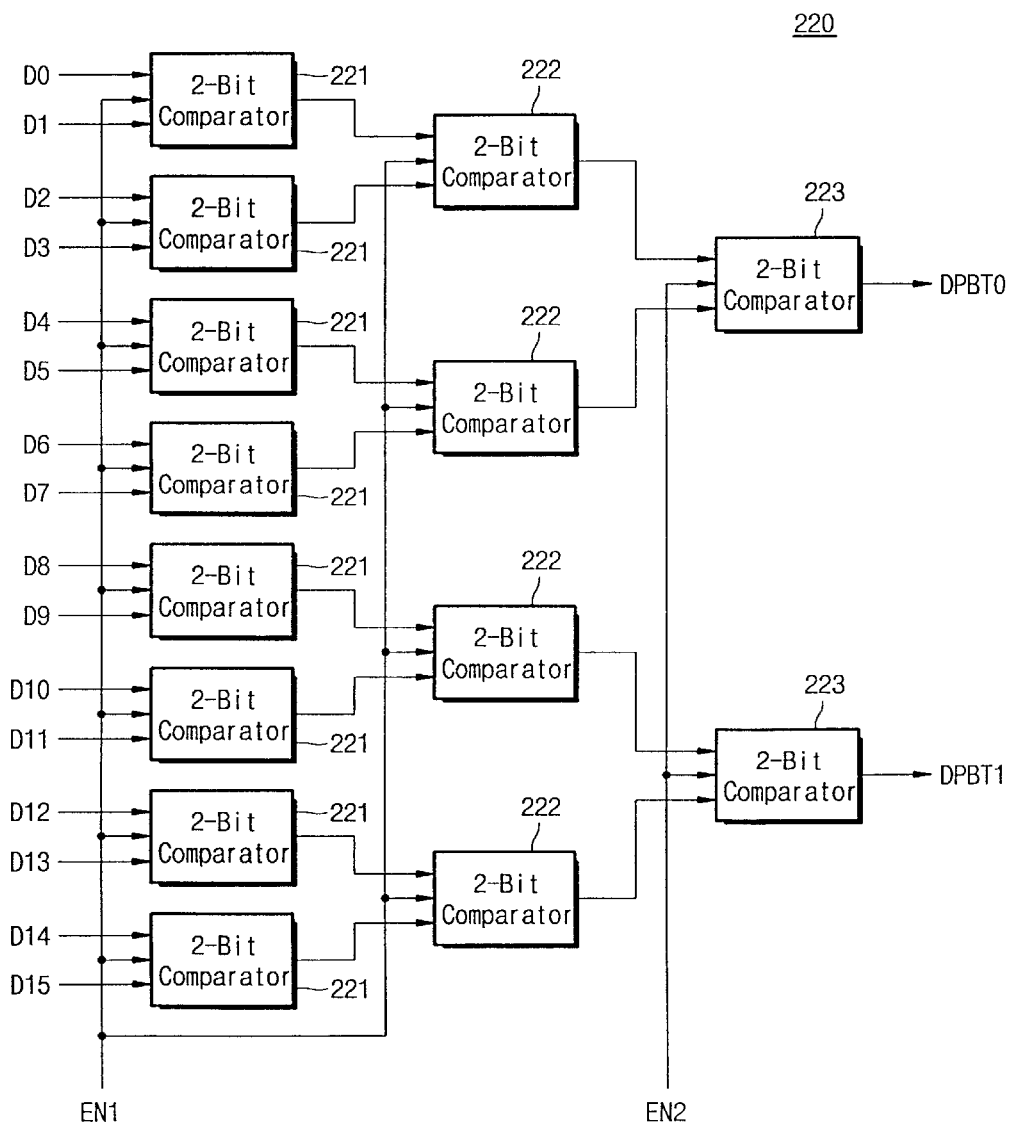
FIG. 6, which is comprised of FIGS. 6A and 6B, is a block diagram of a comparison part of FIG. 5.
Figure 6B:
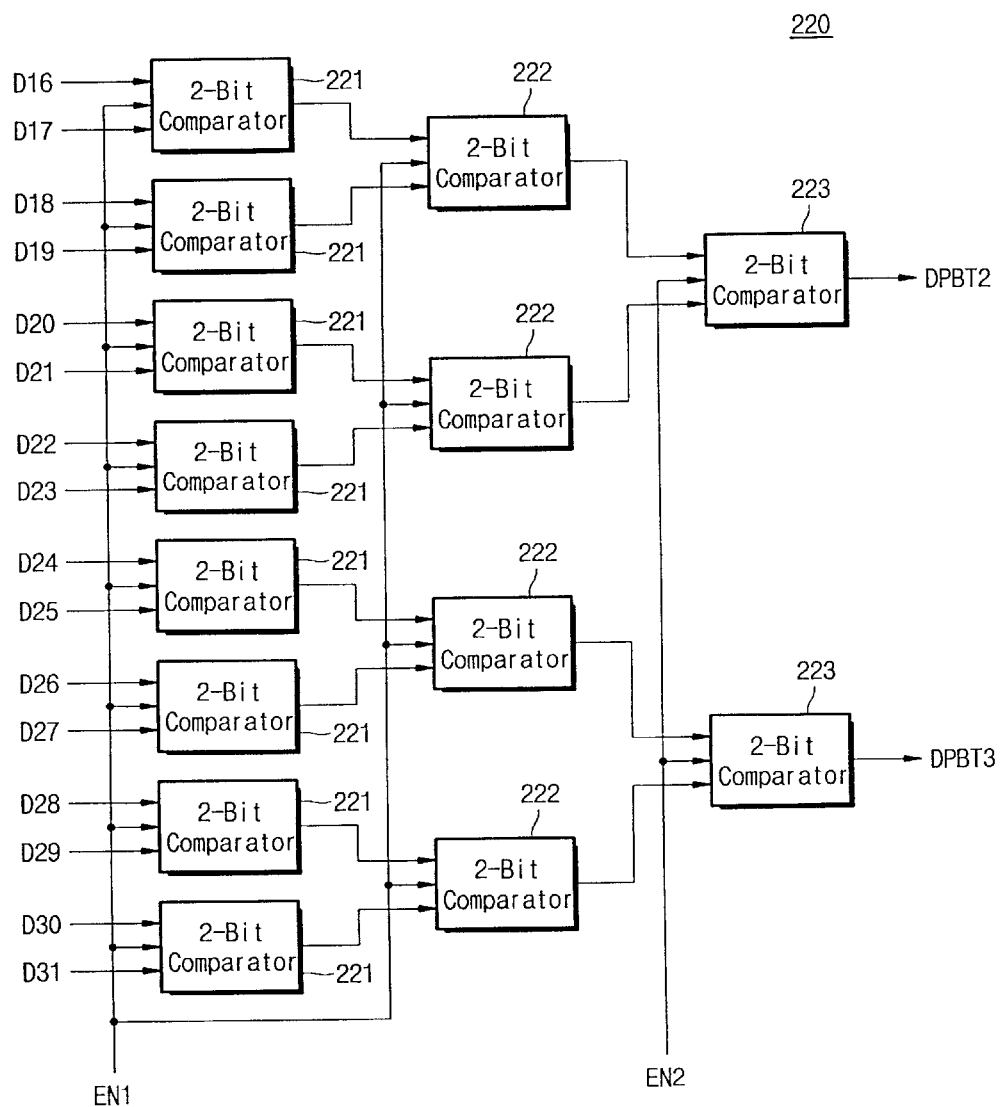

Referring to FIG. 6, comparison part 220 includes sixteen first comparators 221, eight second comparators 222 and four third comparators 223. Comparators 221, 222 and 223 are 2-bit comparators. First comparator enable signal EN1 controls first and second comparators 221 and 222. For instance, first and second comparators 221 and 222 are activated when first comparator enable signal EN1 is activated, and are inactivated when first comparator enable signal EN1 is inactivated. Second comparator enable signal EN2 controls third comparators 223. For instance, third comparators 223 are activated when second comparator enable signal EN2 is activated, and are inactivated when second comparator enable signal EN2 is inactivated.

With reference to FIGS. 1 to 6, a parallel test operation of semiconductor integrated circuit 100 according to an embodiment of the present invention is described. The parallel test (or a multi-bit test) is carried out in wafer test mode operation and in package test mode operation. When integrated circuit (memory device) 100 is tested in the wafer test mode operation, wafer test flag signal PBT_wafer or bank activation signal P4K is activated, and package test flag signal PBT_pkg is inactivated.

A wafer test operation, in which wafer test flag signal PBT_wafer is activated, is described below. When memory device 100 is in the wafer test mode operation, parallel test control circuit 180, in response to the wafer test flag signal PBT_wafer of logic high level, generates control signal COMP_wafer of logic high level and control signal COMP_pkg of logic low level. Address signals that appoint word lines and bit lines are provided to address buffer circuit 120. As described above, control signal COMP_wafer of logic high level sets the bank address signal of the provided address signals at 'don't care' state (activation state) in address buffer circuit 120. This means that banks 110a and 110b are simultaneously selected (activated). Further, since wafer test flag signal PBT_wafer is activated, bit organization address control circuit 190 generates control signal PBT_main of logic high level. Similarly, the bit organization address is also set to 'don't care' state in address buffer circuit 120.

Accordingly, in the wafer test mode operation, sixteen test data bits are read from each of banks 110a and 110b through a read circuit including column selection circuit 140, bit line sense amplifier and column gate circuit 150, and input/output line sense amplifier circuit 160. All thirty-two test data bits D0 to D31 read from banks 110a and 110b are transferred to parallel test circuit 200. In this embodiment, every row of banks 110a and 110b is tested, and the value of the test data read from the cell is either "1" or "0" according to the design of comparison part 220.

Signal generator 210 of parallel test circuit 200, in response to the control signal COMP_wafer of logic high level and the control signal COMP_pkg of logic low level, activates the first comparator enable signal EN1. This causes first and second comparators 221 and 222 of comparison part 220 to be activated and third comparator 223 to be inactivated. Therefore, parallel test circuit 200 outputs eight comparison signals through second eight comparators 222.

As described above, in the wafer test mode operation, parallel test circuit 200 compares thirty-two test data bits, and then outputs eight comparison signals. That is, the wafer test mode operation requires eight data probe pins (not shown) of a probe card (not shown). The wafer test mode operation, which was described above, is a "32-bit wafer test mode", in which eight data probe pins are used or assigned for a memory integrated circuit.

In the wafer test mode operation, where bank activation signal P4K is activated, parallel test control circuit 180 outputs control signal COMP_wafer of logic high level and control signal of logic low level COMP_pkg, and bit organization address control circuit 190 outputs control signal PBT_main of logic low level. Since control signal PBT_main is low, a bit organization address signal provided to address buffer circuit 120 is used. A bank address signal provided to address buffer circuit 120 is set to 'don't care state' (activation state) because of control signal COMP_wafer of logic high level. This means that banks 110a and 110b are simultaneously activated (or selected).

As described above, when bank activation signal P4K is activated, each of bank 110a and 110b operates under the ×8 bit organization. Accordingly, eight test data bits are read from each of bank 110a and 110b through the read circuit. The sixteen test data bits thus read (e.g., D0 to D3, D8 to D11, D16 to D19, and D24 to D27, or D4 to D7, D12 to D15, D20 to D23, and D28 to D31) are provided to comparison part 220 of parallel test circuit 200. Since control signal COMP_wafer of logic high level is outputted from parallel test control circuit 180 in the wafer test mode operation, in which the bank activation signal P4K is activated, signal generator 210 outputs first comparator enable signal EN1 of logic high level and second comparator enable signal EN2 of logic low level. This causes first and second comparators 221 and 222 to be activated and third comparators 223 to be inactivated.

Since sixteen test data bits are provided to comparison part 220, only half of second comparators 222 output valid test results. For instance, signals from four second comparators 222 are transferred to the output buffers (not shown). That is, parallel test circuit 200 compares sixteen test data bits, and then outputs four test result signals. In this wafer test mode operation, which is "a 16-bit wafer test mode", four data probe pins of the probe card is allotted and used for a semiconductor integrated circuit.

When semiconductor integrated circuit 100 operates in the package test mode, wafer test flag signal PBT_wafer and bank activation signal P4K are inactivated, and package test flag signal PBT_pkg is activated. Like in the wafer test mode operation, when memory device 100 enters the package test mode operation, address signals appointing word lines and bit lines are provided to address buffer circuit 120. Parallel test control circuit 180, in response to the package test flag signal PBT_pkg of logic high level, generates control signal COMP_wafer of logic low level and control signal COMP_pkg of logic high level. Bit organization address control circuit 190 generates control signal PBT_main of logic high level, set the bank address signal at 'don't care' state (activation state) in address buffer circuit 120 because of control signal COMP_pkg of logic high level.

This means that banks 110a and 110b are simultaneously selected (activated). The bit organization address signal is also set to 'don't care' state in address buffer circuit 120 because of control signal PBT_main of logic high level.

Accordingly, sixteen test data bits are read from each of banks 110a and 110b through the read circuit. All thirty-two test data bits D0 to D31 thus read are transferred to parallel test circuit 200. Then, signal generator 210 of parallel test circuit 200, in response to the control signal COMP_wafer of logic low level and the control signal COMP_pkg of logic high level, activates first and second comparator enable signals EN1 and EN2. This causes comparators 221, 222, and 223 to be activated. Therefore, as the comparison result of parallel test circuit 200, four comparison signals DPBT0, DPBT1, DPBT2, and DPBT3 (DPBT2 and DPBT3 are not shown) from four third comparators 223 are outputted to corresponding output buffers (not shown).

In the package test mode operation, parallel test circuit 200 compares thirty-two test data bits, and then outputs four comparison signals. That is, four data probe pins (not shown) of the probe card is used. This package test operates in a "32-bit package test mode", in which four data probe pins are allotted and used for a semiconductor integrated circuit.

The present invention can reduce test time of a semiconductor integrated circuit by performing the 16-bit wafer test and the 32-bit package test. The total test time of a semiconductor wafer including integrated circuits is determined by the number of integrated circuit chips to be tested simultaneously. Since the number of chips to be tested is increased by allotting only four probe pins per integrated circuit chip, the total test time decreases. In addition, since the number of test data bits read in the 32-bit package test mode is two times that of the 16-bit wafer test mode, test time in the 32-bit package test mode can be shortened as compared to that of the 16-bit package test mode.

The invention has been described using exemplary embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor integrated circuit comprising:
   a memory cell array including a bank for storing data bit information therein, the bank having a plurality of array blocks, each of which includes memory cells arranged in rows and columns;
   a row selection circuit coupled to the memory cell array for selecting a row of the bank;
   a read circuit that reads test data from the bank;
   a parallel test control circuit that generates a first control signal and a second control signal;
   a bit organization address control circuit that generates a third control signal; and
   a parallel test circuit including a plurality of comparators, and, in response to the first and second control signals, determining a logic level of bits of the test data read have the same logic levels,
   wherein the first, second, and third control signals determine where the test data are read from in the memory cell array.

2. The semiconductor integrated circuit according to claim 1, wherein, in response to a bit organization information signal, the bit organization address control circuit determines a number of bits read from the memory cell array.

3. The semiconductor integrated circuit according to claim 1, further comprising a mode register set circuit coupled to the parallel test control circuit and the bit organization address control circuit.

4. The semiconductor integrated circuit according to claim 1, further comprising an address buffer circuit coupled to the memory cell array, the parallel test control circuit, and the bit organization address control circuit, and, in response to receipt of the first, second, and third control signals, and an address signal, determines whether the address signal is used in determining where the test data are read from in the memory cell array.

5. The semiconductor integrated circuit according to claim 1, wherein the plurality of comparators are organized by groups.

6. A semiconductor integrated circuit comprising:
   a mode register set circuit for generating a wafer test flag signal, a package test flag signal, and a bank activation signal;
   a memory cell array including a bank for storing data bit information therein, the bank having a plurality of array blocks, each of which includes memory cells arranged in rows and columns;
   a read circuit that reads test data from the bank;
   a parallel test control circuit that generates a first control signal and a second control signal in response to the wafer test flag signal, the package test flag signal, and the bank activation signal;
   a bit organization address control circuit that generates a third control signal in response to the wafer test flag signal, the package test flag signal, the bank activation signal, and a bit organization information signal; and
   a parallel test circuit including a plurality of comparators, and, in response to the first and second control signals, determining a logic level of bits of the test data read have the same logic levels,
   wherein the first, second, and third control signals determine where the test data are read from in the memory cell array.

7. The semiconductor integrated circuit according to claim 6, further comprising an address buffer circuit coupled to the memory cell array, the parallel test control circuit, and the bit organization address control circuit, and, in response to receipt of the first, second, and third control signals, and an address signal, determines whether the address signal is used in determining where the test data are read from in the memory cell array.

8. The semiconductor integrated circuit according to claim 6, wherein the bit organization address control circuit performs a first NOR operation on the wafer test flag signal, the package test flag signal, and the bit organization information signal, the bit organization address control circuit performs a second NOR operation on an output of the first NOR operation and the bank activation signal.

* * * * *